US010355181B2

(12) United States Patent
Yamada

(10) Patent No.: US 10,355,181 B2
(45) Date of Patent: Jul. 16, 2019

(54) LIGHT-EMITTING DEVICE, INTEGRATED LIGHT-EMITTING DEVICE, AND LIGHT-EMITTING MODULE

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/039,197

(22) Filed: Jul. 18, 2018

(65) Prior Publication Data

US 2019/0027659 A1 Jan. 24, 2019

(30) Foreign Application Priority Data

Jul. 21, 2017 (JP) .................................. 2017-141924
Oct. 5, 2017 (JP) .................................. 2017-195352

(51) Int. Cl.
*H01L 33/00* (2010.01)
*H01L 33/54* (2010.01)
*H01L 33/50* (2010.01)
*H01L 33/10* (2010.01)
*H01L 25/075* (2006.01)
*F21V 8/00* (2006.01)

(52) U.S. Cl.
CPC .............. *H01L 33/54* (2013.01); *H01L 33/10* (2013.01); *H01L 33/50* (2013.01); *G02B 6/0051* (2013.01); *G02B 6/0073* (2013.01); *H01L 25/0753* (2013.01)

(58) Field of Classification Search
CPC ......... H01L 33/54; H01L 33/10; H01L 33/50; H01L 25/0753; G02B 6/0051; G02B 6/0073
USPC ........................................................... 257/98
See application file for complete search history.

(56) References Cited

U.S. PATENT DOCUMENTS 7,884,538 B2 * 2/2011 Mitsuishi .............. H01L 33/504
313/501
2007/0284600 A1 12/2007 Shchekin et al.
2012/0161176 A1 6/2012 Heo et al.
2013/0300285 A1 11/2013 Ito

FOREIGN PATENT DOCUMENTS

| JP | 2008-004948 A | 1/2008 |
| JP | 2014-500629 A | 1/2014 |
| JP | 2017-085081 A | 5/2017 |
| WO | WO-2012/099145 A1 | 7/2012 |
| WO | WO-2017/069372 A1 | 4/2017 |

* cited by examiner

*Primary Examiner* — Tu-Tu V Ho
(74) *Attorney, Agent, or Firm* — Foley & Lardner LLP

(57) ABSTRACT

A light-emitting device includes: a base member having a conductive pattern; a light-emitting element arranged on the base member so as to be electrically connected to the conductive pattern; and a dielectric multi-layer film located on an upper surface of the light-emitting element. The dielectric multi-layer film has a first spectral reflectivity in an emission peak wavelength region of the light-emitting element and a second spectral reflectivity in a region that is located at a longer wavelength side of the emission peak wavelength region by 50 nm, and the second spectral reflectivity is greater by 10% or more than the first spectral reflectivity.

13 Claims, 5 Drawing Sheets

LIGHT-EMITTING DEVICE, INTEGRATED LIGHT-EMITTING DEVICE, AND LIGHT-EMITTING MODULE

CROSS-REFERENCE TO RELATED APPLICATION

This application claims priority to Japanese Patent Application No. 2017-141924, filed on Jul. 21, 2017 and Japanese Patent Application No. 2017-195352, filed on Oct. 5, 2017, the disclosures of which are hereby incorporated by reference in their entireties.

BACKGROUND

The present disclosure relates to a light-emitting device, an integrated light-emitting device and a light-emitting module.

In recent years, a subadjacent-type surface light-emitting device using a semiconductor light-emitting device has been proposed in the art for use as a backlight of a display device such as a liquid crystal display device. In view of functionality, design, etc., a display device may be demanded to be thin, and a backlight is also demanded to be thinner. A light-emitting device of a general-purpose lighting application may also be demanded to be thin in view of functionality, design, etc.

Typically, when a light-emitting device of such an application is made thinner, brightness non-uniformity on the emission surface is likely to occur. Particularly, when a plurality of light-emitting elements are arranged in a one-dimensional or two-dimensional array, the brightness is higher directly above the light-emitting elements than in regions therearound. Therefore, PCT Publication WO2012/099145, for example, discloses a technique whereby light-emitting elements are encapsulated, and a diffusive member is partially arranged in the vicinity of the region directly above each light-emitting element on the surface of the resin member that functions as a lens, thereby improving the uniformity of light emitted from the light source.

SUMMARY

The present disclosure provides a light-emitting device whose brightness non-uniformity is suppressed.

A light-emitting device of the present disclosure includes: a base member having a conductive pattern; a light-emitting element arranged on the base member so as to be electrically connected to the conductive pattern; and a dielectric multi-layer film provided on an upper surface of the light-emitting element, wherein the dielectric multi-layer film has a first spectral reflectivity in an emission peak wavelength region of the light-emitting element and a second spectral reflectivity in a region that is located at a longer wavelength side by 50 nm than the emission peak wavelength region, and the second spectral reflectivity is greater by 10% or more than the first spectral reflectivity.

The present disclosure provides a light-emitting device having a wide spread of light distribution, in which brightness non-uniformity between regions directly above light-emitting elements and other regions therearound is suppressed.

DETAILED DESCRIPTION

Figure 1:
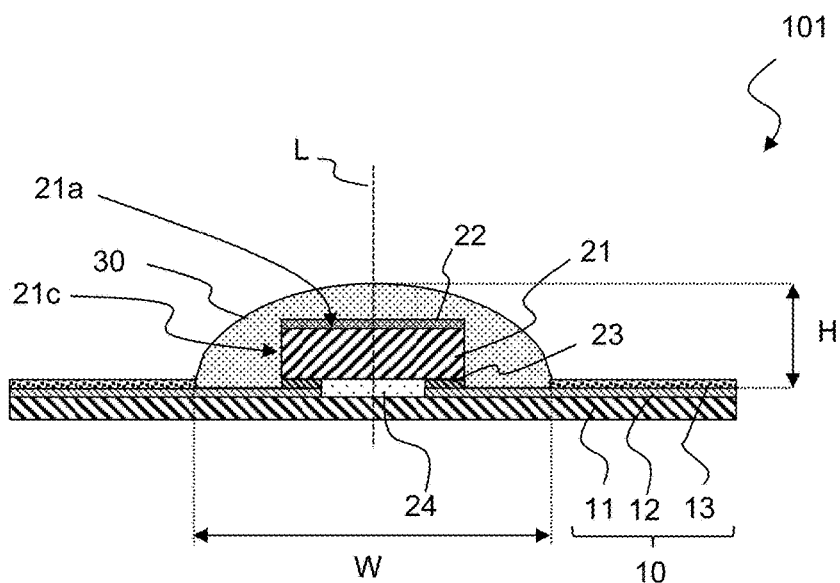
FIG. 1 is a cross-sectional view showing an example of a light-emitting device of a first embodiment.

A light-emitting device, an integrated light-emitting device and a light-emitting module according to embodiments of the present disclosure will now be described with reference to the drawings. The light-emitting device, the integrated light-emitting device and the light-emitting module to be described below are each an example embodiment, and various modifications can be made to each embodiment. In the following description, terms representing specific directions or positions (e.g., "up/upper", "down/lower", "right", "left", and other terms including these words) may be used. These terms are used merely for the ease of understanding of relative directions/positions on the accompanying drawings. As long as the directional/positional relationship defined by terms such as "up/upper" and "down/lower" is consistent throughout the drawings, it does not need to coincide with the directional/positional relationship on drawings other than those of the present disclosure and in actual products, etc. The sizes of components, the positional relationships therebetween, etc., shown in the drawings may be exaggerated for the ease of understanding, and may not strictly reflect those of actual light-emitting devices. Note that some elements may be omitted in schematic cross-sectional views, etc., in order not to excessively complicate the drawings.

First Embodiment

FIG. 1 is a schematic diagram showing a cross-sectional structure of a light-emitting device 101 of the present embodiment. The light-emitting device 101 includes a base member 10, a light-emitting element 21, and a dielectric multi-layer film 22. These components will now be described in detail.

[Base Member 10]

The base member 10 has an upper surface and supports the light-emitting element 21 thereon. The base member 10 supplies electric power to the light-emitting element 21. The base member 10 includes a base material 11 and a conductive pattern 12, for example. The base member 10 may further include an insulative layer 13.

The base material 11 is made of a resin such as a phenol resin, an epoxy resin, a polyimide resin, a BT resin, polyphthalamide (PPA), polyethylene terephthalate (PET), a ceramic, or the like, for example. Among others, it is preferred to select an insulative resin in view of the cost and moldability. Alternatively, a ceramic may be selected as the material of the base material 11 in order to realize a light-emitting device having a good heat resistance and a good light resistance. Examples of the ceramic include alumina, mullite, forsterite, a glass ceramic, a nitride-based substance (e.g., AlN), a carbide-based substance (e.g., SiC), and the like, for example. Among these, it is preferred to use a ceramic made of alumina or a ceramic whose main component is alumina.

When a resin is used as the material of the base material 11, the resin may be mixed with an inorganic filler such as glass fiber, $SiO_2$, $TiO_2$ or $Al_2O_3$ for purposes such as improving the mechanical strength, reducing the coefficient of thermal expansion, and improving the optical reflectivity. The base material 11 may be a composite plate including an insulative layer formed on a metal plate.

The conductive pattern 12 has a predetermined line pattern. The conductive pattern 12 is electrically connected to an electrode of the light-emitting element 21 so as to supply electric power from the outside to the light-emitting element 21. The line pattern includes a positive electrode line connected to the positive electrode of the light-emitting element 21 and a negative electrode line connected to the negative electrode of the light-emitting element 21. The conductive pattern 12 is formed at least on an upper surface of the base member 10, on which the light-emitting element 21 is placed. The material of the conductive pattern 12 may be suitably selected from among conductive materials, depending on the material of the base material 11, the production method of the base material 11, etc. For example, when a ceramic is used as the material of the base material 11, the material of the conductive pattern 12 is preferably a material having a high melting point such that it can withstand the sintering temperature of the ceramic sheet. The material of the conductive pattern 12 is preferably a high-melting metal such as tungsten or molybdenum, for example. A layer of another metal material such as nickel, gold or silver may be further provided by plating, sputtering, vapor deposition, etc., on the line pattern made of a high-melting metal as described above.

When a resin is used as the material of the base material 11, the material of the conductive pattern 12 is preferably a material that is easily machinable. When an injection-molded resin is used, the material of the conductive pattern 12 is preferably a material that can be easily subjected to processes such as a punching process, an etching process and a bending process, and that has a relatively high mechanical strength. Specifically, it is preferred that the conductive pattern 12 is formed from a metal layer, a lead frame, or the like, of a metal such as copper, aluminum, gold, silver, tungsten, iron or nickel, or an iron-nickel alloy, phosphor bronze, iron-containing copper or molybdenum. The conductive pattern 12 may further include a layer of another metal material on the surface of the line pattern made of a metal. Although there is no particular limitation on this material, it may be a layer of silver only, a layer made of an alloy of silver and copper, gold, aluminum, rhodium, or the like, or a multi-layer structure using these materials, silver, and various alloys, for example. The layer of the other metal material may be formed by plating, sputtering, vapor deposition, or the like.

[Insulative Layer 13]

The base member 10 may include the insulative layer 13. The insulative layer 13 is provided on the base material 11 of the base member 10 so as to cover portions of the conductive pattern 12 to which the light-emitting element 21, etc., are connected. That is, the insulative layer 13 is electrically insulative, and covers at least a portion of the conductive pattern 12. Preferably, the insulative layer 13 has light reflectivity. Because the insulative layer 13 has light reflectivity, it is possible to reflect light that is emitted from the light-emitting element 21 toward the base member 10, thereby improving light extraction efficiency. Because the insulative layer 13 has light reflectivity, a portion of light emitted from the light source to be incident on a transparent laminate including a diffuser plate, a wavelength converting member, etc., that is reflected can also be reflected, thereby improving the light extraction efficiency. Light that is reflected by these base members also passes through the transparent laminate, and it is therefore possible to further suppress the brightness non-uniformity.

There is no particular limitation on the material of the insulative layer 13, as long as it is an insulative material that little absorbs light emitted the light-emitting element 21. For example, it may be a resin material such as epoxy, silicone, modified silicone, a urethane resin, an oxetane resin, acrylic, polycarbonate or polyimide. To provide light reflectivity to the insulative layer 13, any of the resin materials of the insulative layer 13 listed above may contain a white filler, which is added to an underfill material to be described later. A white filler will be described later in detail.

[Light Emitting Element 21]

Any of light-emitting elements of various forms may be used as the light-emitting element 21 arranged on the base member 10. The light-emitting element 21 is a light-emitting diode in the present embodiment. Any wavelength may be selected for light emitted from the light-emitting element 21. For example, a blue or green light-emitting element may be a light-emitting element using a semiconductor such as a nitride-based semiconductor ($In_xAl_yGa_{1-x-y}N$, $0 \leq X$, $0 \leq Y$, $X+Y \leq 1$), ZnSe or GaP. A red light-emitting element may be a light-emitting element using a semiconductor such as GaAlAs or AlInGaP. A semiconductor light-emitting device using a material other than those listed above may be used. One can select, as necessary, the composition, emission color and size of the light-emitting element, and the number of light-emitting elements to be used.

When the light-emitting element 21 includes a wavelength converting member, it is preferred that the light-emitting element 21 uses a nitride semiconductor ($In_xAl_yGa_{1-x-y}N$, $0 \leq X$, $0 \leq Y$, $X+Y \leq 1$) emitting light of a short wavelength that is capable of efficiently exciting the wavelength converting material included in the wavelength converting member. One can select from among a variety of emission wavelengths depending on the material and crystal mix degree of the semiconductor layer. The light-emitting element 21 may include the positive electrode and the negative electrode on the same surface, or may include the positive electrode and the negative electrode on different surfaces.

The light-emitting element 21 includes a growth substrate and a semiconductor layer layered on the growth substrate. The semiconductor layer includes an n-type semiconductor layer, a p-type semiconductor layer, and an active layer sandwiched therebetween. The negative electrode and the positive electrode are electrically connected to the n-type semiconductor layer and the p-type semiconductor layer, respectively. The growth substrate may be a transparent sapphire substrate, or the like, for example.

The n-side electrode and the p-side electrode of the light-emitting element 21 are flip-chip bonded on the base member 10 via a connection member 23 therebetween. Specifically, the positive electrode and the negative electrode of the light-emitting element 21 are connected to a positive electrode line and a negative electrode line included in the conductive pattern 12 of the base member 10 via the connection member 23. The light-extracting surface is a surface of the light-emitting element 21 that is opposite from a surface thereof where the n-side electrode and the p-side electrode are formed, i.e., an upper surface 21a of the light-emitting element 21, which is the primary surface of the transparent sapphire substrate. In the present embodiment, in order to reduce the brightness directly above the light-emitting element 21, the dielectric multi-layer film 22 is arranged on the upper surface 21a. Therefore, a lateral surface 21c of the light-emitting element 21 also serves substantially as the light-extracting surface.

[Connection Member 23]

The connection member 23 is formed from a conductive material. Specifically, the material of the connection member 23 may be an Au-containing alloy, an Ag-containing alloy, a Pd-containing alloy, an In-containing alloy, a Pb—Pd-containing alloy, an Au—Ga-containing alloy, an Au—Sn-containing alloy, an Sn-containing alloy, an Sn—Cu-containing alloy, an Sn—Cu—Ag-containing Alloy, an Au—Ge-containing alloy, an Au—Si-containing alloy, an Al-containing alloy, a Cu—In-containing alloy, a mixture of a metal and a flux, etc.

The connection member 23 may be any of those in a liquid form, a paste form or a solid form (a sheet form, a block form, a powder form, a wire form), and the selection can be made appropriately depending on the composition, the shape of the support, etc. The connection member 23 may be formed as a single member or a combination of some members.

[Underfill Member 24]

An underfill member 24 may be arranged between the light-emitting element 21 and the base member 10. The underfill member 24 contains a filler for purposes such as efficiently reflecting light from the light-emitting element 21 and bringing the coefficient of thermal expansion close to the light-emitting element 21. Because the lateral surface 21c of the light-emitting element 21 is also a light-extracting surface in the present embodiment, as shown in FIG. 1, it is preferred that the underfill member 24 does not cover the lateral surface 21c.

The underfill member 24 includes, as the matrix, a material that little absorbs light from the light-emitting element. For example, it may be epoxy, silicone, modified silicone, a urethane resin, an oxetane resin, acrylic, polycarbonate, polyimide, or the like.

Using a white filler as the filler of the underfill member 24, light is more likely to be reflected, and it is possible to improve the light extraction efficiency. It is preferred that the filler is an inorganic compound. White, as used herein, includes what appears to be white because of scattering when there is a refractive index difference between the filler and the material around the filler even if the filler itself is clear.

The reflectivity of the filler is preferably 50% or more, and more preferably 70% or more, with respect to light of the emission wavelength of the light-emitting element 21. With these reflectivities, it is possible to improve the light extraction efficiency of the light-emitting device 101. The particle size of the filler is preferably 1 nm or more and 10 µm or less. When the particle size of the filler is in this range, the resin fluidity as the underfill material improves, and the material to be the underfill member 24 can desirably fill even small gaps. Note that the particle size of the filler is preferably 100 nm or more and 5 µm or less, and more preferably 200 nm or more and 2 µm or less. The filler may be spherical or scale-shaped.

Specifically, examples of the filler material include oxides such as $SiO_2$, $Al_2O_3$, $Al(OH)_3$, $MgCO_3$, $TiO_2$, $ZrO_2$, $ZnO$, $Nb_2O_5$, $MgO$, $Mg(OH)_2$, $SrO$, $In_2O_3$, $TaO_2$, $HfO$, $SeO$ and $Y_2O_3$, nitrides such as SiN, AlN and AlON, and fluorides such as $MgF_2$. Any of these materials may be used alone or mixed with others.

[Dielectric Multi-Layer Film 22]

The dielectric multi-layer film 22 is a member (e.g., a half mirror) that allows a portion of the incident light to pass therethrough while reflecting another portion of the incident light. The dielectric multi-layer film 22 is provided on the upper surface 21a of the light-emitting element 21. With such a configuration, a portion of the light exiting through the upper surface 21a of the light-emitting element 21 is reflected by the dielectric multi-layer film 22 back into the light-emitting element 21 so as to exit through the lateral surface 21c of the light-emitting element 21. As a result, the amount of light to exit through the upper surface 21a of the light-emitting element 21 is reduced and the brightness directly above the light-emitting element 21 is lowered, thereby suppressing the brightness non-uniformity in cases in which light-emitting devices 101 are used to make a backlight, or the like. Note however that with a dielectric multi-layer film having a typical spectral reflection characteristic provided on the upper surface 21a of the light-emitting element 21, when light emitted from the light-emitting device 101 is observed through a diffuser plate, the brightness is higher in regions around regions that are directly above the light-emitting elements if the distance between the diffuser plate and the light-emitting element is short, as will be described later. That is, brightness non-uniformity is likely to occur.

Figure 2:
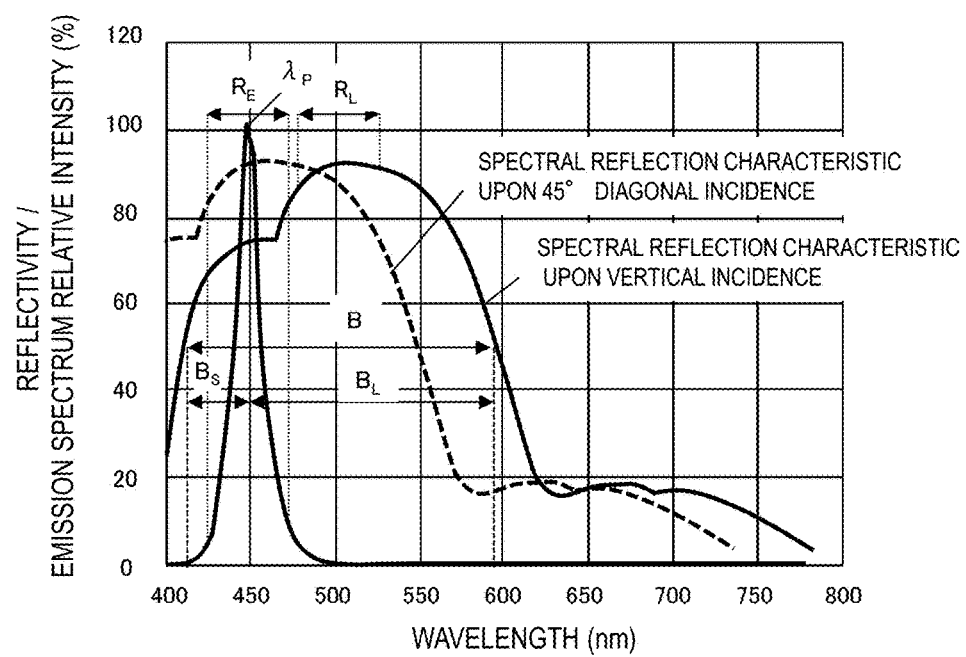
FIG. 2 is a graph showing an example of a spectral reflection characteristic of a dielectric multi-layer film of the light-emitting device shown in FIG. 1.

In order to suppress such brightness non-uniformity, the dielectric multi-layer film 22 has a spectral reflectivity characteristic that includes at least two regions of different spectral reflectivities in the reflection wavelength band. FIG. 2 shows, by a solid line, a schematic spectral reflectivity characteristic of the dielectric multi-layer film 22. FIG. 2 also shows a schematic example of an emission spectrum of light emitted from the light-emitting element 21.

The dielectric multi-layer film 22 has a spectral reflectivity characteristic such that the spectral reflectivity (second spectral reflectivity) in the region $R_L$, which is on the longer wavelength side of the emission peak wavelength region $R_E$ of the light-emitting element 21 by 50 nm, is greater by 10% or more than the spectral reflectivity (first spectral reflectivity) in the emission peak wavelength region $R_E$ of the light-emitting element 21. Herein, the spectral reflectivity is a value for vertically incident light. The emission peak wavelength region $R_E$ is a wavelength region of a predetermined width centered about the peak wavelength $\lambda_p$, of the light-emitting element 21. For example, it is a wavelength region of $\lambda_{E1}$ or more and $\lambda_{E2}$ or less ($\lambda_{E1} < \lambda_{E2}$). The band of the emission peak wavelength region $R_{E1}$ is determined depending on the characteristics of light emitted from the light-emitting element 21. For example, when the light-emitting element 21 is an LED emitting blue light, the band of the emission peak wavelength region $R_E$ may be $\lambda_p \pm 20$ nm.

The region $R_L$ is a region that includes a region whose upper limit and lower limit are on the longer wavelength side of the upper limit and the lower limit by 50 nm, respectively, of the emission peak wavelength region $R_E$. Specifically, the region $R_L$ is a wavelength region of ($\lambda_{E1}$+50) nm or more and ($\lambda_{E2}$+50) nm or less. The spectral reflectivity in the region $R_L$ being greater, by 10% or more, than the spectral reflectivity in the emission peak wavelength region $R_E$ means that the spectral reflectivity at any wavelength in the region $R_L$ is greater, by 10% or more, than the maximum spectral reflectivity in the emission peak wavelength region $R_E$. The spectral reflectivity in the emission peak wavelength region $R_E$ is 70% or more and 95% or less, and the spectral reflectivity in the region $R_L$ is 80% or more and less than 100%. The emission peak wavelength region $R_E$ and the region $R_L$ do not overlap each other.

The reflection wavelength band B upon vertical incidence is defined as a region that includes the emission peak wavelength region $R_E$ and the region $R_L$ and in which the spectral reflectivity is 50% or more. The reflection wavelength band B of the dielectric multi-layer film 22 includes the emission peak wavelength of the light-emitting element, and the band $B_L$ on the longer wavelength side of the emission peak wavelength is wider than the band $B_S$ on the shorter wavelength side thereof.

The dielectric multi-layer film 22 is transparent and has a dielectric multi-layer film structure in which a plurality of dielectric layers having different refractive indices are layered together. The material of each dielectric layer is preferably a material that absorbs little light in the wavelength range emitted from the light-emitting element 21, e.g., a metal oxide film, a metal nitride film, a metal fluoride film or an organic material. An organic layer such as a silicone resin or a fluororesin may be used as each dielectric layer.

The spectral reflectivity characteristics of the dielectric multi-layer film 22 (specifically, the positions of the emission peak wavelength region $R_E$ and the region $R_L$, the spectral reflectivity thereof, etc.) can be set to any characteristics by adjusting the thickness of the dielectric layer, the refractive index thereof, the number of layers, etc. The spectral reflectivity, etc., of the emission peak wavelength region $R_E$ and those of the region $R_L$ can be designed separately from each other.

[Encapsulation Member 30]

The light-emitting device 101 may include an encapsulation member 30. The encapsulation member 30 protects the light-emitting element 21 from the ambient environment, and optically controls the distribution characteristic of the light output from the light-emitting element 21. That is, the light emission direction is adjusted based primarily on the refraction of light through the outer surface of the encapsulation member 30. The encapsulation member 30 is arranged on the base member 10 covering the light-emitting element 21.

The surface of the encapsulation member 30 has a curved surface protruding upward. The encapsulation member 30 preferably has a circular or elliptical outer shape as seen from above. For the encapsulation member 30, the ratio H/W between the height H in the optical axis L direction and the width W as seen from above is preferably less than 0.5. More preferably, H/W is 0.3 or less. The height H of the encapsulation member 30 is defined by the distance in the optical axis L direction from the mounting surface of the base member 10 to the highest portion of the encapsulation member 30. The width W is based on the shape of the bottom surface of the encapsulation member 30. The width W is defined as the diameter when the bottom surface is circular, and as the shortest width across the bottom surface when the bottom surface has any other shape. For example, when the outer shape as seen from above is an elliptical shape, the width W is defined as the short axis (between the long axis and the short axis) of the bottom surface.

When the encapsulation member 30 has such a shape, light emitted from the light-emitting element 21 refracts through the interface between the encapsulation member 30 and the air, and it is possible to increase the spread of the light distribution.

The material of the encapsulation member 30 may be a transparent resin such as an epoxy resin or a silicone resin, or a mixed resin thereof, or a glass, etc. Among others, a silicone resin is preferably selected for its light fastness and moldability.

The encapsulation member 30 may include a wavelength converting material and a light diffuser for diffusing light from the light-emitting element 21. It may also include a colorant corresponding to the emission color of the light-emitting element. The wavelength converting material, the light diffusing material, the colorant, etc., are preferably contained in the encapsulation member 30 in such amounts that the light distribution can be controlled based on the outer shape of the encapsulation member 30. In order to suppress the influence on the light distribution characteristic, the particle size of each material to be contained is preferably 0.2 µm or less. Note that the particle size, as used herein, means the average particle size (median diameter), and the value of the average particle size can be measured by a laser diffraction method.

[Emission and Effects of Light-Emitting Device 101]

In the light-emitting device 101, the dielectric multi-layer film 22 is provided on the upper surface 21a of the light-emitting element 21. With such a configuration, a portion of the light exiting through the upper surface 21a of the light-emitting element 21 is reflected by the dielectric multi-layer film 22 back into the light-emitting element 21 so as to exit through the lateral surface 21c of the light-emitting element 21. As a result, this reduces the amount of light to exit through the upper surface of the light-emitting element 21 and lowers the brightness directly above the light-emitting element 21, thereby suppressing the brightness non-uniformity in cases in which light-emitting devices 101 are used to make a backlight, or the like.

Figure 3:
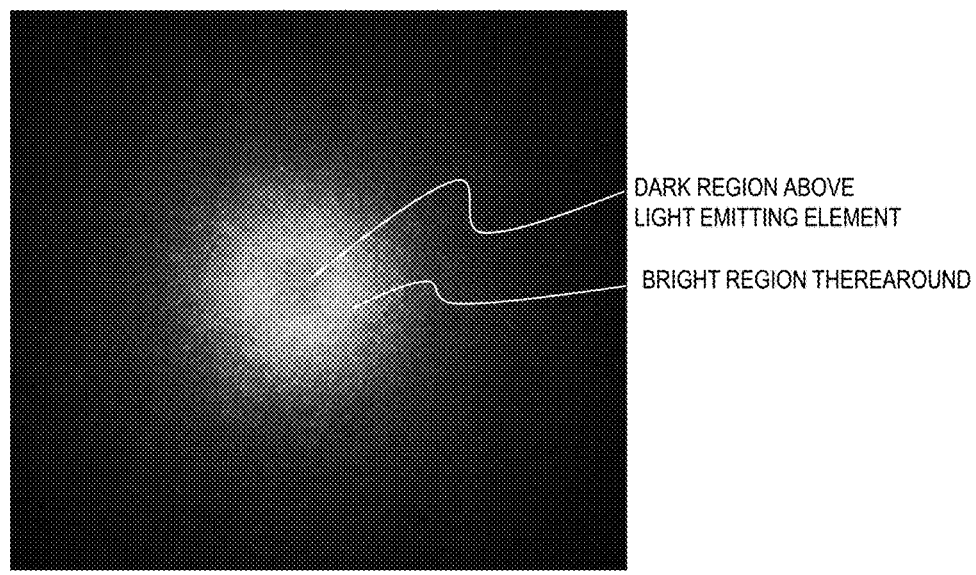
FIG. 3 shows how light is emitted as seen through a diffuser plate, with an ordinary dielectric multi-layer film provided on the upper surface of a light-emitting element.

However, as a result of a study by the present inventor, it has been found that when a dielectric multi-layer film is provided on the upper surface of the light-emitting element and a diffuser plate, or the like, is arranged on the emission side of the light-emitting device to form a backlight, the brightness in the vicinity of the region directly above the light-emitting element becomes lower than the brightness therearound if the gap between the diffuser plate and the light-emitting element is short. FIG. 3 shows how light is emitted as seen through a diffuser plate, with an ordinary dielectric multi-layer film, i.e., a dielectric multi-layer film that does not have the spectral characteristic of the dielectric multi-layer film 22, provided on the upper surface of the light-emitting element. It is believed that, if the interval OD (see FIG. 5) between the diffuser plate and the light-emitting element is short, light that vertically exits through the upper surface of the light-emitting element primarily reaches the region directly above the light-emitting element, whereas light that is reflected by the dielectric multi-layer film to exit through the lateral surface of the light-emitting element is unlikely to reach there. In other words, when a dielectric multi-layer film is provided on the upper surface 21a of the light-emitting element 21, the brightness is higher in regions around regions that are directly above the light-emitting elements, thus causing brightness non-uniformity. If the reflectivity of the dielectric multi-layer film is lowered, the brightness in regions directly above the light-emitting elements increases, but the brightness in regions therearound also increases, failing to substantially reduce the brightness non-uniformity.

Figure 4:
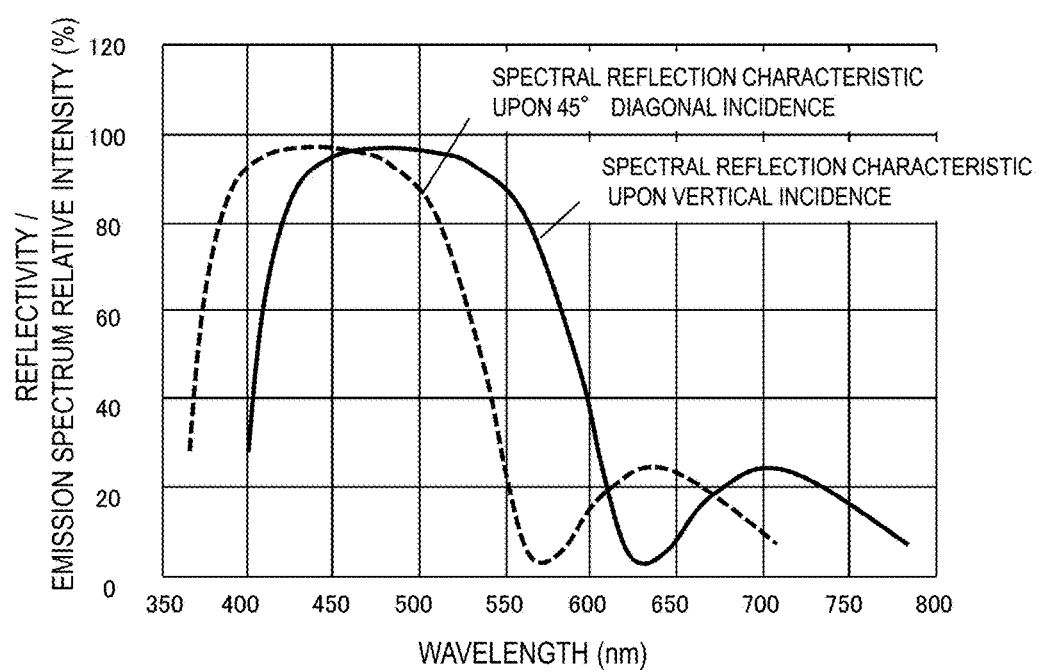
FIG. 4 is a graph showing the incident angle dependence of the spectral reflection characteristic of the dielectric multi-layer film.

In the light-emitting device 101 of the present disclosure, the incident angle dependence of the spectral reflection characteristic of the dielectric multi-layer film is utilized so as to suppress the brightness non-uniformity described above. Typically, the spectral reflection characteristic of a dielectric multi-layer film varies between when light is incident vertically on the dielectric multi-layer film and when light is incident diagonally. When light is incident diagonally, as compared with when light is incident vertically, the optical path length increases, and the reflection wavelength band shifts toward the short wavelength side. This characteristic is also referred to as blue shift. FIG. 4 is a graph schematically showing an example of the spectral reflection characteristic of the dielectric multi-layer film, wherein the solid line represents the spectral reflection characteristic with respect to vertically incident light, and the broken line represents the spectral reflection characteristic with respect to light that is incident from a direction inclined by 45° from the vertical direction. While the reflection wavelength band with respect to vertically incident light is about 430 nm to about 550 nm, the reflection wavelength band with respect to incident light inclined by 45° is 350 nm to 500 nm. The amount of shift of the spectral reflection characteristic toward the short wavelength side is about 40 nm at about 400 nm, and about 80 nm at about 700 nm.

As shown in FIG. 4, with an ordinary dielectric multi-layer film, the spectral reflectivity is substantially constant in the reflection wavelength band. However, the dielectric multi-layer film 22 used in the light-emitting device 101 of the present disclosure has a spectral reflectivity characteristic that includes the emission peak wavelength region $R_E$ and the region $R_L$ having different spectral reflectivities in the reflection wavelength band, as shown in FIG. 2. Thus, light beams with the same peak wavelength can be reflected with different spectral reflectivities depending on the incident angle.

FIG. 2 schematically shows an example of a reflectivity characteristic of the dielectric multi-layer film 22 in the light-emitting device 101 of the present embodiment. The solid line represents the spectral reflection characteristic of vertically incident light, and the broken line represents the reflection characteristic with respect to light that is incident from a direction inclined by 45° from the vertical direction. In the example shown in FIG. 2, the emission peak wavelength of the light-emitting element 21 is about 450 nm, and the emission peak wavelength region $R_E$ is 430 nm to 470 nm. The region $R_L$ is 480 nm to 520 nm. The spectral reflectivity in the emission peak wavelength region $R_E$ is about 75%, and the spectral reflectivity in the region $R_L$ is about 92%. That is, light that is vertically incident on the dielectric multi-layer film 22 is reflected with a spectral reflectivity of about 75%, but light that is diagonally incident on the dielectric multi-layer film 22 is reflected with a spectral reflectivity of about 92% at maximum.

As a result of an in-depth study, it has been found that with a light-emitting element 21 that emits blue light, for example, if the amount of shift is set to 50 nm, it is possible to increase the brightness in the region directly above the light-emitting element 21 while lowering the brightness in regions therearound, thereby efficiently reducing the brightness non-uniformity.

Figure 5:
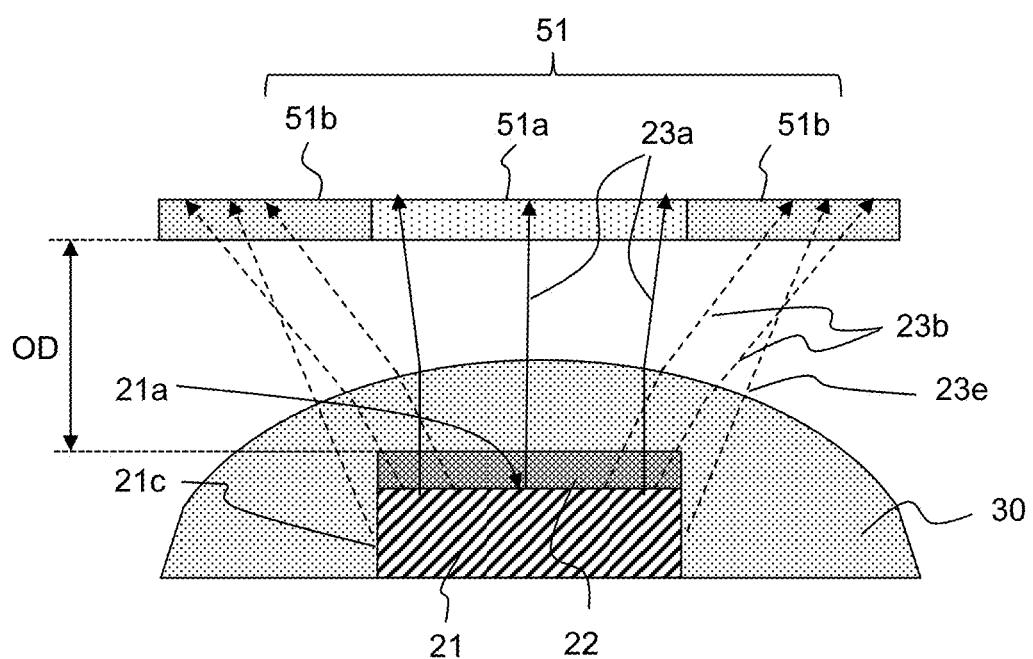
FIG. 5 is a schematic diagram showing how light is emitted from a light-emitting element of the light-emitting device shown in FIG. 1.

FIG. 5 schematically shows how light emitted from the light-emitting device 101 travels to reach a diffuser plate 51.

When the distance OD between the light-emitting element 21 and the diffuser plate 51 is short, a region 51a of the diffuser plate 51 that is directly above the light-emitting element 21 primarily receives light 23a that exits through the upper surface 21a of the light-emitting element 21 to be vertically incident on and pass through the dielectric multi-layer film 22, as shown in FIG. 5. In contrast, a region 51b around the region 51a receives light 23b that is diagonally incident on and passes through the dielectric multi-layer film 22 and light 23e that exits through the lateral surface 21c. As described above, when passing through the dielectric multi-layer film 22, the spectral reflectivity is 75% for light 23a, whereas the spectral reflectivity is 92% for light 23b. Therefore, more light 23b reaches the diffuser plate 51 than light 23a, thereby relatively increasing the brightness in the region 51b of the diffuser plate 51 and decreasing the brightness in the region 51a. Thus, light emitted from the light-emitting element 21 having the dielectric multi-layer film 22 can have, along a plane including the optical axis L, a batwing-shaped light distribution characteristic having a small brightness difference between the central portion and the peripheral portion. A batwing-shaped light distribution characteristic is generally defined as an emission intensity distribution such that the emission intensity is higher at a light distribution angle whose absolute value is greater than 0°, 0° being the optical axis L. Particularly, in a specific sense, it is defined as an emission intensity distribution such that the emission intensity is highest around 45° to 90°.

With the provision of the dielectric multi-layer film 22 described above, the light-emitting device 101 lowers the brightness in the region directly above the light-emitting element 21 and reduces the brightness non-uniformity. This means that the spread of the light distribution for light emitted from the light-emitting device 101 is increased, i.e., more light is emitted even at low angles. For example, 25% or more of the total amount of light emitted from the light-emitting device 101 of the present disclosure can be emitted at elevation angles of less than 20° with respect to the upper surface of the base member 10.

By forming the encapsulation member 30 so that the outer shape thereof is a curved surface protruding upward and making the height-to-width ratio H/W less than 0.5, it is possible to increase the spread of the light distribution for light emitted from the light-emitting element 21. For example, if the ratio H/W of the height H to the width W of the encapsulation member 30 is set to 0.3 or less, 40% or more of the total amount of light emitted from the light-emitting device 101 can be emitted at elevation angles of less than 20° with respect to the upper surface of the base member 10. Thus, with these two configurations, it is possible to realize an intended light distribution characteristic without using a secondary lens. That is, with the provision of the dielectric multi-layer film 22, it is possible to reduce the brightness directly above the light-emitting element 21. Therefore, the encapsulation member 30 can be provided with the primary function of increasing the spread of the light distribution for light emitted from the light-emitting element 21. Thus, it is possible to significantly reduce the size of the encapsulation member 30 having a lens function. Therefore, using the light-emitting device 101, it is possible to realize a thin backlight module (light-emitting module) with improved brightness non-uniformity.

With conventional light-emitting devices, the encapsulation member is provided with the function of reducing the brightness directly above the light-emitting element and the function of increasing the spread of the light distribution. Therefore, it is necessary to provide an encapsulation member that has a relatively large outer shape and that functions also as a secondary lens, for example.

Second Embodiment

Figure 6A:
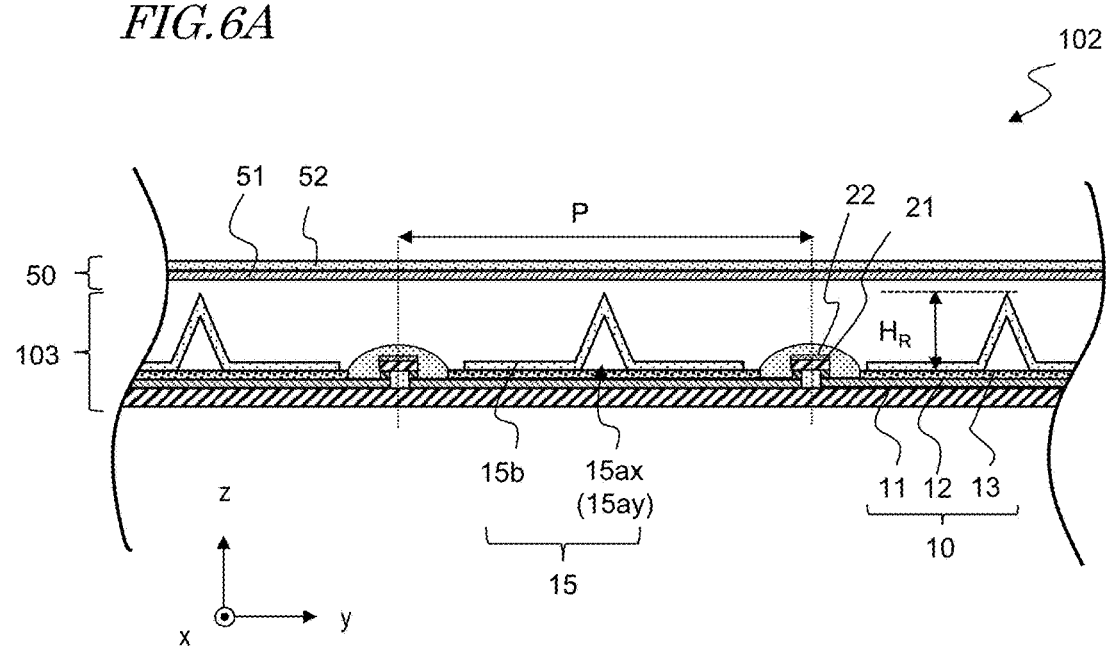
FIG. 6A is a cross-sectional view showing an example of a light-emitting module of a second embodiment.
Figure 6B:
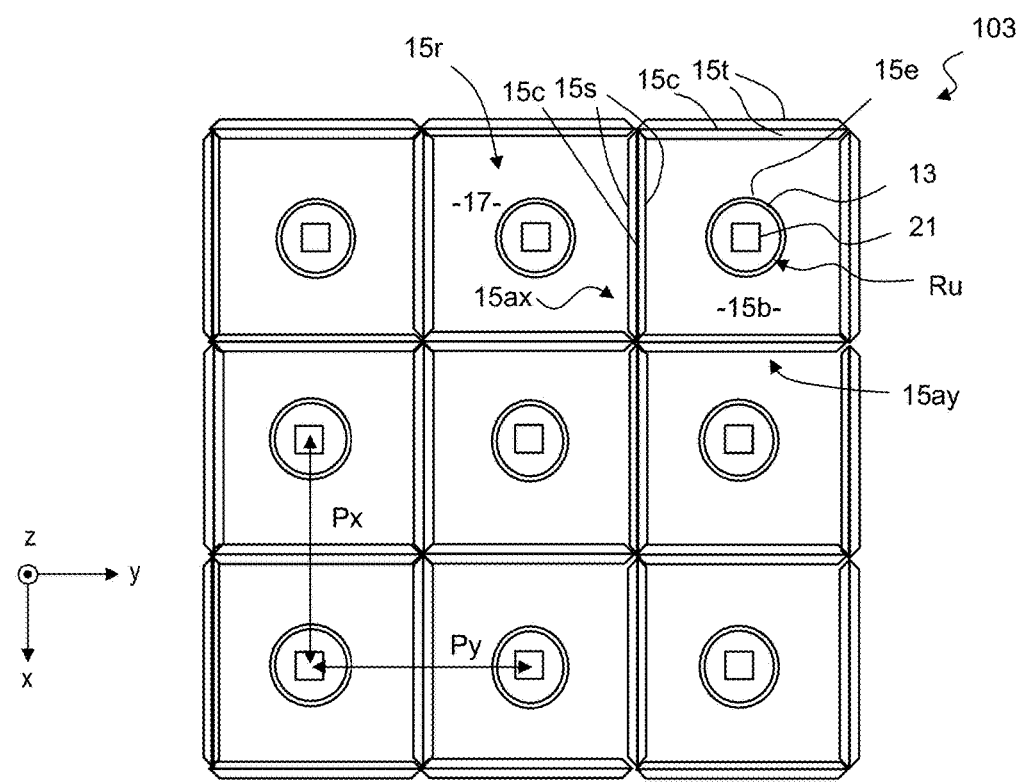
FIG. 6B is a top view showing an integrated light-emitting device of the light-emitting module shown in FIG. 6A.

FIG. 6A is a schematic diagram showing a cross-sectional structure of a light-emitting module 102 of the present embodiment. The light-emitting module 102 includes a transparent laminate 50 and an integrated light-emitting device 103. FIG. 6B is a top view of the integrated light-emitting device 103.

The integrated light-emitting device 103 includes the base member 10, a plurality of light-emitting elements 21 arranged on the base member 10, and the dielectric multi-layer film 22 provided on the upper surface of each light-emitting element 21. The structure of the base member 10, the light-emitting element 21 and the dielectric multi-layer film 22, and the relationship between these components are as described above in the first embodiment.

The plurality of light-emitting elements 21 are arranged in a one-dimensional or two-dimensional array on an upper surface 11a of the base member 10. In the present embodiment, the plurality of light-emitting elements 21 are arranged in two directions perpendicular to each other, i.e., arranged in a two-dimensional array along the x direction and the y direction, wherein the pitch px thereof in the x direction and the pitch py thereof in the y direction are equal to each other. However, the directions of arrangement are not limited thereto. The pitch in the x direction and the pitch in the y direction may be different from each other, and the two directions of arrangement may not be perpendicular to each other. The pitch does is not limited to a regular pitch, but rather may be an irregular pitch. For example, the light-emitting elements 21 may be arranged so that the pitch therebetween gradually increases from the center toward the periphery of the base member 10.

The integrated light-emitting device 103 may include a plurality of light reflective members 15 located between the light-emitting elements 21. The light reflective member 15 includes wall portions 15ax and 15ay, and a bottom portion 15b. As shown in FIG. 6B, the wall portion 15ay extending in the y direction is arranged between two light-emitting elements 21 adjacent to each other in the x direction, and the wall portion 15ax extending in the x direction is arranged between two light-emitting elements 21 adjacent to each other in the y direction. Therefore, each light-emitting element 21 is surrounded by two wall portions 15ax extending in the x direction and two wall portions 15ay extending in the y direction. The bottom portion 15b is located in a region 15r that is surrounded by two wall portions 15ax and two wall portions 15ay. In the present embodiment, because the pitch of the light-emitting elements 21 in the x direction is equal to that in the y direction, the outer shape of the bottom portion 15b is square. A through hole 15e is provided in the center of the bottom portion 15b, and the bottom portion 15b is located on the insulative layer 13 so that the light-emitting element 21 is located in the through hole 15e. There is no particular limitation on the shape and size of the through hole 15e as long as the shape and size are such that the light-emitting element 21 can be located therein. It is preferred that the outer edge of the through hole 15e is located in the vicinity of the light-emitting element 21, i.e., the gap between the through hole 15e and the light-emitting element 21 as seen from above is small, so that light from the light-emitting element 21 can also be reflected by the bottom portion 15b.

As shown in FIG. 6A, along the yz cross section, the wall portion 15ax includes a pair of inclined surfaces 15s extending in the x direction. The pair of inclined surfaces 15s are connected together along one of the two edges thereof extending in the x direction, thereby forming a top portion 15c. The other edge of each of the pair of inclined surfaces 15s is connected to the bottom portion 15b located in the corresponding one of the two adjacent regions 15r. Similarly, the wall portion 15ay extending in the y direction includes a pair of inclined surfaces 15t extending in the y direction. The pair of inclined surfaces 15t are connected together along one of the two edges thereof extending in the y direction, thereby forming a top portion 15c. The other edge of each of the pair of inclined surfaces 15t is connected to the bottom portion 15b located in the corresponding one of the two adjacent regions 15r.

The bottom portion 15b, two wall portions 15ax and two wall portions 15ay together form a light-emitting space 17 having an opening therein. FIG. 6B shows light-emitting spaces 17 arranged in an array of three rows and three columns. The pair of inclined surfaces 15s and the pair of inclined surfaces 15t are facing the opening of the light-emitting space 17.

The light reflective member 15 has a light reflectivity, and reflects light emitted from the light-emitting element 21 toward the opening of the light-emitting space 17 by means of the inclined surfaces 15s and 15t of the wall portions 15ax and 15ay. Light incident on the bottom portion 15b is also reflected toward the opening of the light-emitting space 17. Thus, light emitted from the light-emitting element 21 can be made to enter the transparent laminate 50 efficiently.

The light-emitting spaces 17 partitioned by the light reflective members 15 is the minimum unit of light-emitting space when the plurality of light-emitting elements 21 are driven independently. It is the minimum unit area of local dimming when the upper surface of the transparent laminate 50 of the light-emitting device 101 is observed as a surface light emission source. When the plurality of light-emitting elements 21 are driven independently, a light-emitting device is realized that can be driven with local dimming by the smallest unit of light-emitting space. Local dimming by a larger unit can be realized by simultaneously driving a plurality of light-emitting elements 21 adjacent to each other by syncing ON/OFF thereof.

The light reflective member 15 may be formed by using a resin containing a reflective material that is made of particles of a metal oxide such as titanium oxide, aluminum oxide or silicon oxide, or it may be formed by using a resin containing no reflective material and then providing a reflective material on the surface. The reflectivity of the light reflective member 15 with respect to light emitted from the light-emitting element 21 is preferably 70% or more, for example.

The light reflective member 15 can be formed by molding using a mold or stereolithography. The molding method using a mold may be a molding method such as an injection molding, an extrusion molding, a compression molding, a vacuum molding, a pressure molding or a press molding. For example, by vacuum molding using a reflective sheet made of PET, or the like, it is possible to obtain the light reflective member 15 including the bottom portion 15b and the wall portions 15ax and 15ay formed integral together. The thickness of the reflective sheet is 100 μm to 500 μm, for example.

The lower surface of the bottom portion 15b of the light reflective member 15 and the upper surface of the insulative layer 13 are secured together via an adhesive member, or the like. The insulative layer 13 exposed through the through hole 15e preferably has a light reflectivity. It is preferred that an adhesive member is arranged around the through hole 15e so that light emitted from the light-emitting element 21 does not enter between the insulative layer 13 and the light reflective member 15. For example, an adhesive member is preferably arranged in a ring shape along the outer edge of the through hole 15e. The adhesive member may be a double-sided adhesive tape, a hotmelt-type adhesive sheet, or an adhesive liquid of a thermosetting resin or a thermoplastic resin. Preferably, these adhesive members are highly flame-retarded. Instead of an adhesive member, the securing can be done by using other attachment members such as screws and pins.

Each region Ru surrounded by a plurality of light reflective members 15 can be regarded as one light-emitting device 101 having the light-emitting element 21. That is, the integrated light-emitting device 103 includes a plurality of light-emitting devices 101 arranged at the pitch Px in the x direction and at the pitch Py in the y direction.

The height HR of the light reflective member 15 is preferably less than or equal to 0.3 time, and more preferably less than or equal to 0.2 time, the pitch of the light-emitting device 101. When the light-emitting devices 101 are arranged in a two-dimensional array, the pitch is the shorter one of the two pitches in the two directions. Because the pitch px in the x direction is equal to the pitch py in the y direction in the present embodiment, the height HR is less than or equal to 0.3 times Px and Py, i.e., HR≤0.3 Px or HR≤0.3 Py. As the height HR of the light reflective member 15 satisfies this condition, it is possible to shorten the distance between the transparent laminate 50 and the integrated light-emitting device 103 and realize a thin light-emitting module.

The transparent laminate 50 is arranged on the light-extracting surface side of each light-emitting device 101 of the integrated light-emitting device 103, i.e., on the upper surface side of the light-emitting element 21 of the base member 10. The transparent laminate 50 may be in contact with, or spaced apart from, the light reflective member 15. The transparent laminate 50 includes the diffuser plate 51 and a wavelength converting member 52.

The diffuser plate 51 allows incident light to pass therethrough while diffusing the light. The diffuser plate 51 is formed from a material that little absorbs visible light, such as a polycarbonate resin, a polystyrene resin, an acrylic resin or a polyethylene resin, for example. A light-diffusing structure is provided in the diffuser plate 51 by providing protrusions/depressions on the surface of the diffuser plate 51 or dispersing a material having a different refractive index in the diffuser plate 51. The diffuser plate 51 may be any of those on the market under the names "light diffusing sheet" or "diffuser film."

The wavelength converting member 52 is located on one of the two primary surfaces of the diffuser plate 51 that is opposite from the surface facing the light-emitting device 101. The wavelength converting member 52 absorbs a portion of light emitted from the light-emitting device 101 and emits light of a wavelength that is different from the wavelength of the light emitted from the light-emitting device 101.

Because the wavelength converting member 52 is spaced apart from the light-emitting element 21 of the light-emitting device 101, it is possible to use a light conversion material that is less resistant to heat and light, which is difficult to employ in the vicinity of the light-emitting element 21. Therefore, it is possible to improve the performance of the light-emitting device 101 as a backlight. The wavelength converting member 52 has a sheet shape or a layer shape, and includes a wavelength converting substance.

Examples of the wavelength converting substance include a cerium-activated yttrium aluminum garnet (YAG)-based phosphor, a cerium-activated lutetium aluminum garnet (LAG), a europium- and/or chromium-activated nitrogen-containing alumino calcium silicate ($CaO-Al_2O_3-SiO_2$)-based phosphor, a europium-activated silicate ($(Sr,Ba)_2SiO_4$)-based phosphor, a β sialon phosphor, a nitride-based phosphor such as a CASN-based or SCASN-based phosphor, a KSF-based phosphor ($K_2SiF_6$:Mn), and a sulfide-based phosphor, for example. In addition to these phosphors, any phosphor may be used that has a similar performance, function and/or effect.

The wavelength converting member 52 may include any of light-emitting substances so-called "nanocrystal" and "quantum dot", for example. These materials may be semiconductor materials, e.g., II-VI group, III-V group and IV-VI group semiconductors, and specific examples thereof include nano-sized high dispersion particles such as CdSe, core-shell-type $CdS_xSe_{1-x}$/ZnS and GaP.

Using the light-emitting module 102, it is possible to suppress the brightness non-uniformity even with a thin structure.

Third Embodiment

Figure 7A:
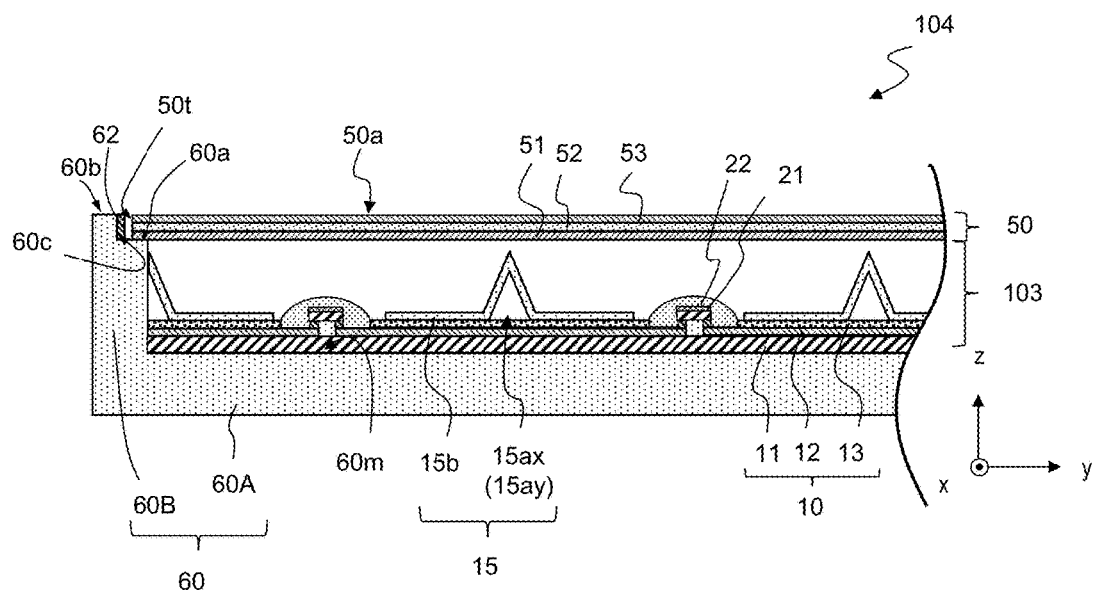
FIG. 7A is a cross-sectional view showing an example of a backlight of a third embodiment.

FIG. 7A is a schematic diagram showing a cross-sectional structure of a backlight 104 of the present embodiment. The backlight 104 includes a housing 60 and the light-emitting module 102.

The housing 60 includes a bottom portion 60A and a side portion 60B. The bottom portion 60A has a primary surface 60m supporting the integrated light-emitting device 103 of the light-emitting module 102, and the base material 11 of the base member 10 is in contact with the primary surface 60m, for example. The side portion 60B is arranged on the bottom portion 60A so as to surround the integrated light-emitting device 103 supported on the primary surface 60m, and includes a first flat surface 60a, a second flat surface 60b and a lateral surface 60c. In the present embodiment, because the integrated light-emitting device 103 and the transparent laminate 50 each have a rectangular shape as seen from above, the side portion 60B is arranged in four locations corresponding to the four sides of the rectangular shape. That is, the housing includes four side portions 60B corresponding to the four sides of the rectangular shape, and each side portion 60B includes the first flat surface 60a, the second flat surface 60b and the lateral surface 60c.

The first flat surface 60a of the side portion 60B supports the end portion of the transparent laminate 50. Thus, the transparent laminate 50 is arranged on the light-extracting surface side of the light-emitting devices 101 of the integrated light-emitting device 103, i.e., on the upper surface side of the light-emitting element 21 of the base member 10. As described above, the transparent laminate 50 may be in contact with, or spaced apart from, the light reflective member 15.

The second flat surface 60b is farther away from the primary surface 60m of the bottom portion 60A than the first flat surface 60a in the z axis direction. The second flat surface 60b is to be in contact with the end portion of a display panel such as a liquid crystal display panel, to which the backlight 104 is attached. Thus, the backlight 104 is attached to a display panel.

The lateral surface 60c is located between the first flat surface 60a and the second flat surface 60b in the z axis direction and faces the lateral surface (end face) 50t of the transparent laminate 50. When the laminate 50 has a rectangular shape as described above, the lateral surface 60c of the housing 60 faces each of the four lateral surfaces 50t of the laminate 50 and surrounds the laminate 50 along the four lateral surfaces 50t.

The backlight 104 preferably includes a reflective film 62 supported on the housing 60. Specifically, the reflective film 62 is provided as a reflective member on the lateral surface 60c of the housing 60, and the reflective film 62 preferably faces the lateral surface 50t. The reflective film 62 preferably has a reflective characteristic to diffusely reflect the incident light. The reflective film 62 can be formed from a similar material to the material of the insulative layer 13, for example. Specifically, a material obtained by mixing a white filler in a resin such as epoxy, silicone, modified silicone, a urethane resin, an oxetane resin, acrylic, polycarbonate or polyimide can be used as the reflective film 62. There may be a gap between the reflective film 62 and the lateral surface 50t of the laminate 50, or the reflective film 62 may be in contact with the lateral surface 50t with no gap therebetween.

In the backlight 104, the reflective film 62 reflects light emitted from the lateral surface 50t of the transparent laminate 50 and have the light travel from the lateral surface 50t back into the transparent laminate 50. Threrefore, the light that is not subject to wave conversion is reduced to tend to emit outide from the side the lateral surface 50t of the transparent member 50 or through the peripheral portion of an upper surface 50a of the transparent member 50 more than through the central portion of the upper surface 50a so that the peripheral portion of an upper surface 50a does notappear bluish as compared with the central portion to cause a poor emission color uniformity. As a result, it is possible to realize a backlight that is thin and has a high uniformity of emitted light.

The backlight 104 may include, in the transparent laminate 50, other layers such as a prism sheet and a reflective layer, in addition to the diffuser plate 51 and the wavelength converting layer 52. For example, another transparent layer 53 such as a prism sheet or a reflective polarizer sheet for increasing the light component that is vertically incident on the display panel may be provided. When the transparent laminate 50 includes the transparent layer 53 having such an optical characteristic, light that propagates through the transparent layer 53 and exits through the lateral surface 50t of the transparent laminate 50 may increase, thereby lowering the uniformity of light in the peripheral portion of the upper surface 50a as described above. Even in such a case, it is possible with the backlight 104 to increase the uniformity of light emitted from the backlight 104 because of the function of the reflective film 62 described above.

Figure 7B:
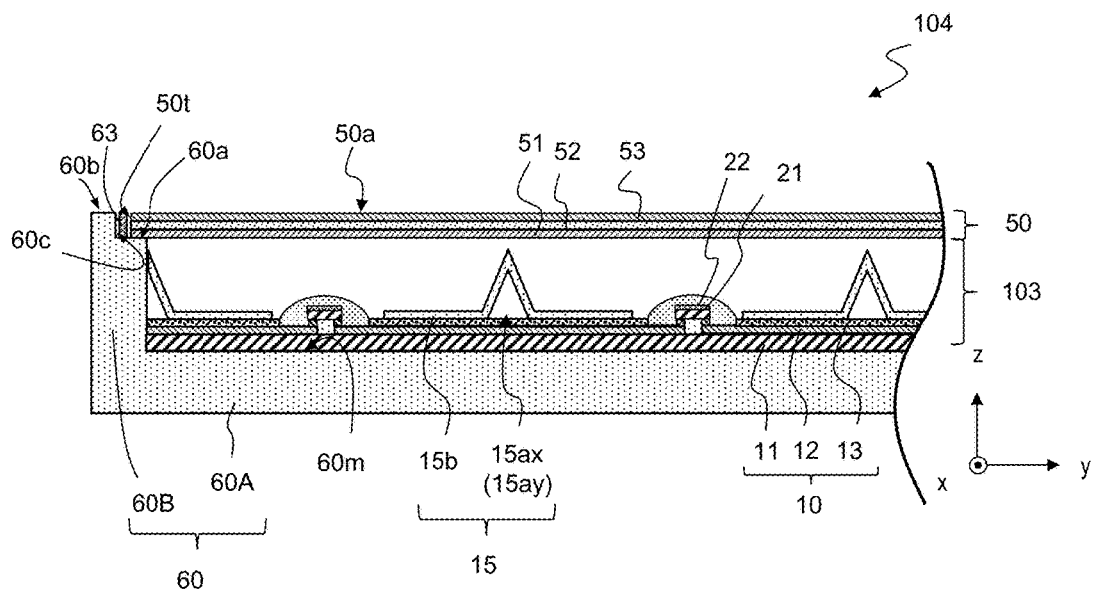
FIG. 7B is a cross-sectional view showing another example of a backlight of a third embodiment.

As shown in FIG. 7B, instead of providing the reflective film 62 on the lateral surface 60c of the housing 60, the backlight 104 may include a reflector plate 63 supported on the first flat surface 60a as a reflective member between the lateral surface 60c and the lateral surface 50t of the transparent laminate 50. The reflector plate 63 may be made entirely of a reflective material, or may include a non-reflective substrate and a reflective film formed on the surface of the substrate. The reflector plate 63 faces the lateral surface 50t of the transparent laminate 50. Also, in a case in which the backlight 104 includes the reflector plate 63, it is possible to increase the uniformity of emitted light as described above.

As described above, a backlight of the present embodiment includes a light-emitting module, a transparent laminate including the wavelength converting member and the dielectric multi-layer film, a housing that supports an integrated light-emitting device of the light-emitting module and the transparent laminate with a predetermined gap therebetween, and a reflective member supported on the housing and facing the lateral surface of the transparent laminate.

Another backlight of the present embodiment includes a light-emitting module, a transparent laminate including the wavelength converting member and the dielectric multi-layer film, and a reflective member facing the lateral surface of the transparent laminate.

A light-emitting device, an integrated light-emitting device and a light-emitting module of the present disclosure can be used in various light sources such as backlights of liquid crystal displays and lighting apparatuses.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device comprising:
a base member having a conductive pattern;
a light-emitting element arranged on the base member so as to be electrically connected to the conductive pattern; and
a dielectric multi-layer film located on an upper surface of the light-emitting element,
wherein the dielectric multi-layer film has a first spectral reflectivity in an emission peak wavelength region of the light-emitting element and a second spectral reflectivity in a region that is located at a longer wavelength side of the emission peak wavelength region by 50 nm, and the second spectral reflectivity is greater by 10% or more than the first spectral reflectivity.

2. The light-emitting device of claim 1, wherein the first spectral reflectivity is greater than or equal to 70% and less than or equal to 95%.

3. The light-emitting device of claim 1, wherein a reflection wavelength band of the dielectric multi-layer film upon vertical incidence includes an emission peak wavelength of the light-emitting element, and a portion of the reflection wavelength band on a longer wavelength side of the emission peak wavelength is wider than a portion of the reflection wavelength band on a shorter wavelength side of the emission peak wavelength.

4. The light-emitting device of claim 1, wherein 25% or more of a total amount of light emitted from the light-emitting device is emitted at elevation angles of less than 20° with respect to an upper surface of the base member.

5. The light-emitting device of claim 1, further comprising:
an encapsulation member covering the light-emitting element and the dielectric multi-layer film,
wherein a ratio H/W of a height H of the encapsulation member to a width W of the encapsulation member is less than 0.5.

6. The light-emitting device of claim 5, wherein 40% or more of a total amount of light emitted from the light-emitting device is emitted at elevation angles of less than 20° with respect to an upper surface of the base member.

7. The light-emitting device of claim 6, wherein the ratio H/W of the height H of the encapsulation member to the width W of the encapsulation member is less than or equal to 0.3.

8. The light-emitting device of claim 1, wherein the light-emitting element is flip-chip bonded on the base member.

9. An integrated light-emitting device comprising:
   a plurality of the light-emitting devices of claim 1; and
   a plurality of light reflective members arranged between the plurality of light-emitting devices.

10. The integrated light-emitting device of claim 9, wherein a height of the light reflective member is less than or equal to 0.3 times a distance between the light-emitting devices.

11. The integrated light-emitting device of claim 9, wherein a height of the light reflective member is less than or equal to 0.2 times a distance between the light-emitting devices.

12. A light-emitting module comprising:
   the light-emitting device of claim 1; and
   a wavelength converting member located on a light-extracting surface side of the light-emitting device, wherein the wavelength converting member is adapted to absorb a portion of light from the light-emitting element and to emit light of a wavelength that is different from an emission wavelength of the light-emitting element.

13. A light-emitting module comprising:
   the integrated light-emitting device of claim 9; and
   a wavelength converting member located on a light-extracting surface side of the light-emitting device, wherein the wavelength converting member is adapted to absorb a portion of light from the light-emitting element and to emit light of a wavelength that is different from an emission wavelength of the light-emitting element.

* * * * *